United States Patent
Kino

[11] 3,961,289
[45] June 1, 1976

[54] ULTRASONIC DELAY MATERIAL
[75] Inventor: Yoshihiro Kino, Kawasaki, Japan
[73] Assignee: Matsushita Electric Industrial Co., Ltd., Japan
[22] Filed: Aug. 30, 1974
[21] Appl. No.: 502,187

Related U.S. Application Data
[63] Continuation-in-part of Ser. No. 340,458, March 12, 1973, abandoned.

[30] Foreign Application Priority Data
Mar. 15, 1972 Japan.............................. 47-27035

[52] U.S. Cl................................. 333/30 R; 310/9.8
[51] Int. Cl.² ..................... H03H 9/26; H03H 9/30
[58] Field of Search ................ 333/30 R, 30 M, 29; 310/9.5, 8, 8.1, 8.2, 8.3, 8.9; 252/62.51, 62.62; 423/594, 595, 605–607

[56] References Cited
UNITED STATES PATENTS
3,296,555   1/1967   Fraser ......................... 333/30 R X
3,387,233   6/1968   Parker, Jr. ...................... 333/30 R OTHER PUBLICATIONS
Rodrigue, "Magnetoelastic Waves – New Mechanisms for Energy Transport" in IEEE spectrum, June 1965; pp. 81–85.

Primary Examiner—Alfred E. Smith
Attorney, Agent, or Firm—Robert E. Burns; Emmanuel J. Lobato; Bruce L. Adams

[57] ABSTRACT

A spinel-type oxide exhibiting a cooperative Jahn-Teller effect shows an extraordinary reduction of sound velocity therethrough at temperatures near the Jahn-Teller phase transition temperature thereof. The sound velocity and effective temperature range can be varied over wide ranges by using a solid solution of such an oxide and another spinel-type oxide not exhibiting the Jahn-Teller effect. $NiCr_2O_4$ and $ZnCr_2O_4$ are particularly advantageous as the former and latter oxides, respectively.

10 Claims, 4 Drawing Figures

ULTRASONIC DELAY MATERIAL

This application is a continuation-in-part of application Ser. No. 340,458, filed Mar. 12, 1973, entitled "Delay Material" and now abandoned.

The present invention relates generally to time delay of sonic waves in a solid medium and more particularly to a process of producing time delays of signals by passing sonic waves through a specific spinel-type oxide and a time delay device using such an oxide as an essential material thereof.

Utilization of the time of a sonic wave propagation through a medium such as quartz occupies an important position in the art of producing time delays of signals. In an electrical circuit, for example, a device usually called an untrasonic delay line is frequently used to provide a signal delay by converting an electrical signal to a ultrasonic signal and then, after passing the latter signal through the device, reconverting the delayed signal to an electrical signal. The thus obtained delay time is essentially dependent on the kind of the medium for passing the ultrasonic signal and its effective signal path length.

It is a general object of the present invention to utilize a newly discovered phenomenon with respect to a specific spinel-type oxide for the purpose of delaying ultrasonic signals.

It is another object of the invention to provide a ultrasonic delay device which produces an extraordinarily long delay time as compared with its size.

It is still another object of the invention to provide such a device, the delay time of which is accurately dependent on the ambient temperature.

The invention is essentially based on my discovery that an ultrasonic signal introduced into a single crystal of a spinel-type oxide exhibiting a cooperative Jahn-Teller effect at temperatures near and above the Jahn-Teller phase transition temperature of the oxide exits from the crystal with a remarkable extent of time delay. The discovery includes that the extent of such time delay is dependent on the crystal temperature and that the discovered phenomenon occurs also in a solid solution of the above oxide and another spinel-type oxide not exhibiting the Jahn-Teller effect. In the case of such a solid solution, both the Jahn-Teller phase transition temperature of and the sound velocity through the oxide vary as the composition of the solid solution is varied. From the practical point of view, $NiCr_2O_4$ is preferred as the spinel-type oxide exhibiting a cooperative Jahn-Teller phase transition and $ZnCr_2O_4$ as the another oxide to form a solid solution with $NiCr_2O_4$.

The invention will be fully understood from the following detailed description with reference to the accompanying drawings, in which.

Figure 1:
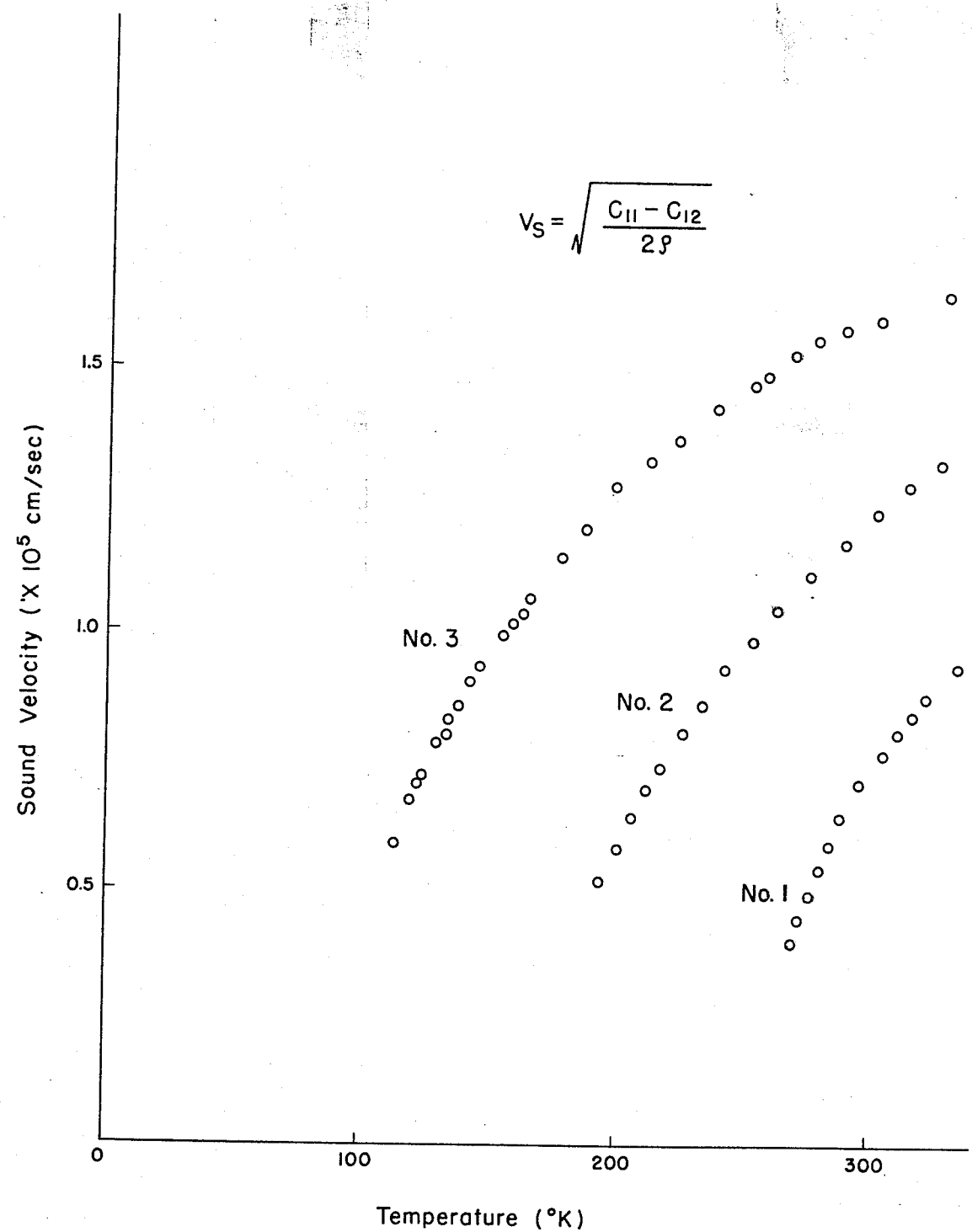
FIG. 1 is a graph illustrating the temperature dependence of sound velocity in a single crystal of a spinel-type oxide system exhibiting a cooperative Jahn-Teller effect.

Among oxides having spinel-type crystal structure, $Mn_3O_4$, $CuFe_2O_4$, $CuCr_2O_4$, $NiCr_2O_4$ and $FeCr_2O_4$ are known to be transformed from the cubic phase to the tetragonal phase at their respective Jahn-Teller phase transition temperatures. The following table indicates the respective ions of these oxides contributing to the Jahn-Teller effect (J.T. Ions), together with the axial ratios ($c/a$) in the tetragonal phase and phase transition temperatures of these substances.

|  | J.T. IONS | AXIAL RATIO (c/a) | TRANS'N TEMP. |
|---|---|---|---|
| $Mn_3O_4$ | $Mn^{3+}$(octahedral sites) | 1.10 | 1,100°C |
| $CuFe_2O_4$ | $Cu^{2+}$(octahedral sites) | 1.06 | 360°C |
| $CuCr_2O_4$ | $Cu^{2+}$(tetrahedral sites) | 0.91 | 630°C |
| $NiCr_2O_4$ | $Ni^{2+}$(tetrahedral sites) | 1.04 | 27°C |
| $FeCr_2O_4$ | $Fe^{2+}$(tetrahedral sites) | 0.98 | −141°C |

With respect to each of the above "J.T. ions", one of its electron orbitals is in the state of triple degeneracy or high energy level when the substance takes cubic phase. If the crystal is cooled to its Jahn-Teller transition temperature, the triple degeneracy tends to be resolved into a state of lower energy level accompanied with a crystallographic phase transition from cubic to tetragonal. In other words, there occurs a transformation from a crystal structure of high symmetry to another of less symmetry. Such a local phase transition of each tetrahedron or octahedron due to the Jahn-Teller effect occurs in a crystal of the above substances with a transformation axis of uniform direction. Accordingly, these substances are defined as to exhibit a cooperative Jahn-Teller effect. The resulting tetragonal structure at temperatures below the indicated transition temperature is regarded less symmetric as the deviation of its axial ratio value from 1 increases.

My study of this $Zn_{0.22}$of oxides has revealed that they show unexpected changes in their behavior or response to elastic sonic waves at their respective Jahn-Teller phase transition temperatures. The extent of the change is far greater than is expected from ordinary phase transition phenomena in other crystalline substances. When these substances are kept at temperatures above the respective transition temperatures, sound velocities in them show extraordinary reduction as the temperature is lowered until the reduction becomes maximum at the transition temperatures. These solid substances appear to be turned into extremely elastic or "soft" substances at temperatures near the transition temperatures. The observed lowest sound velocity values are in the order of $10^2$ m/sec. Such an order of sound velocity has thus far been observed only in gaseous media. I have concluded that such an extraordinary phenomenon is attributed to the combined effects of the Jahn-Teller phase transition and certain macroscopic strains within the crystals of these oxides.

When the velocity of a transverse or shear ultrasonic wave propagating through a single crystal of an oxide is represented by V, the effective wave path length in the single crystal by S and the elapsed time between the entry and emerging of the transverse wave into and from the crystal by $t$, then the following relation holds:

$$S = V \cdot t \qquad \text{Eq. 1}$$

Whereas, it has been ascertained by the inventor that an elastic stiffness constant of a single crystal of the above described spinel-type oxides varies broadly when the Jahn-Teller phase transition occurs in the single crystal.

Among the elastic stiffness constants $c_{11}$, $c_{44}$ and $c_{11}-c_{12}$ of the cubic crystal system, the constant $c_{11}-c_{12}$ shows a particularly large change as the crystal undergoes the transformation from the cubic to the tetragonal. When the transverse ultrasonic wave advances in the direction of $<1\ 10>$ accompanied by polarization or vibration in the direction of $<1\ \bar{1}0>$ in the single crystal, the particular elastic stiffness constant $c_{11}-c_{12}$ has the following relationship between the sound velocity V:

$$V^2 = (c_{11} - c_{12})/2\rho \qquad \text{Eq. 2}$$

where $\rho$ stands for the density of the crystal. If, in this instance, the length of the crystal is L, the distance S through which the transverse wave travels back and forth in the single crystal equals 2L so that Eqs. 1 and 2 result, when combined, in $$V = 2L/t = \sqrt{(c_{11} - c_{12})/2\rho} \qquad \text{Eq. 3}$$

Since the constant $c_{11} - c_{12}$ of the spinel-type crystal, exhibiting the cooperative Jahn-Teller effect, steeply decreases at the transition temperature, the elapsed time $t$ increases as will be understood from Eq. 3. This means that a signal in ultrasonic form entering the crystal is delivered therefrom with a certain amount of time delay, when the crystal is maintained in the vicinity of and above its phase transition temperature.

Although any of the above-described spinel-type oxides exhibits the particular sound velocity reduction, at least theoretically, the present invention contemplates $NiCr_2O_4$ as the only one practical for use as an ultrasonic delay material because only this substance is obtainable in the form of single crystal large enough for practical use, because it shows a major degree of sound velocity reduction and because its phase transition temperature is near room temperature. The last reason is of practical importance since, otherwise, provision of heating or cooling means is required.

$NiCr_2O_4$ occurs in the cubic phase at temperatures above 27°C as shown in the table (supra) and in the tetragonal phase at temperatures below 27°C due to Jahn-Teller effect, resulting from the presence of $Ni^{2+}$ ions in the tetrahedral sites. A quite large extent of crystallographic deformation is involved in its phase transition as seen from the $c/a$ ratio value of 1.04. About 50% of the total deformation occurs suddenly at 27°C. Furthermore, a macroscopic deformation or strain of the crystal accompanying this phase transition is estimated to be as large as of the order of 10%.

Besides, I have found that the afore-mentioned Jahn-Teller transition occurs, and hence the sound velocity reduction can be attained, also in a mixed crystal or solid solution of $NiCr_2O_4$ and another spinel-type oxide selected from those which do not exhibit Jahn-Teller effect. The latter oxide may be selected from spinel-type oxides having a divalent ion such as $Mg^{2+}$, $Cd^{2+}$, $Mn^{2+}$ and $Zn^{2+}$, but I prefer $ZnCr_2O_4$ mainly from the viewpoint of obtaining an adequate single crystal of the solid solution. In $Ni_xZn_{1-x}Cr_2O_4$ system, Jahn-Teller transition can be observed when "x" is at least 0.65, and both the extent of the sound velocity reduction and the transition temperature can be varied over wide ranges by altering the $x$ value.

FIG. 1 illustrates the variations in the sound velocity V propagation in the direction $<110>$ accompanied by polarization in the direction of $<1\bar{1}0>$ in a single crystal of $Ni_xZn_{1-x}Cr_2O_4$ system at various temperatures. In FIG. 1, the plots Nos. 1, 2 and 3 indicate the solid solution crystals of $Ni_xZn_{1-x}Cr_2O_4$ in which the value $x$ is 0.94, 0.78 and 0.70, respectively, so that the crystals denoted by Nos. 1, 2 and 3 occur in the following proportions, respectively:

No. 1: $Ni_{0.94}Zn_{0.06}Cr_2O_4$
No. 2: $Ni_{0.78}Zn_{0.22}Cr_2O_4$
No. 3: $Ni_{0.70}Zn_{0.30}Cr_2O_4$

FIG. 1 clearly indicates that the sound velocity V decreases as the temperature of the crystal decreases toward the phase transition temperature. The sound velocity of the ultrasonic wave propagating in the crystal maintained at a given temperature increases as the value $x$ decreases or, in other words, the quantity of nickel in the crystal decreases. The crystals Nos. 1, 2 and 3 provided delay times of 16 $\mu$sec/cm, 7 $\mu$sec/cm and 4 $\mu$sec/cm, respectively, at 300°K.

The sound velocities of the transverse wave travelling in the single crystals were measured by the Sing-Around method. As is well known in the art, the variation in the sound velocity in the single crystal can thus be accurately detected to the order of $10^{-6}$.

From the tests conducted in this manner, it has been ascertained that the delay material according to the present invention provides delay times which are prolonged by about two to ten times the delay times of about 2 to 3 $\mu$sec/cm for conventional quartz. The delay times achieved by the material according to the present invention can be substantially and arbitrarily varied by selection of the temperature to which the material is to be subjected during operation and/or through variation of the proportion between the component oxides forming the mixed crystal.

Figure 2:
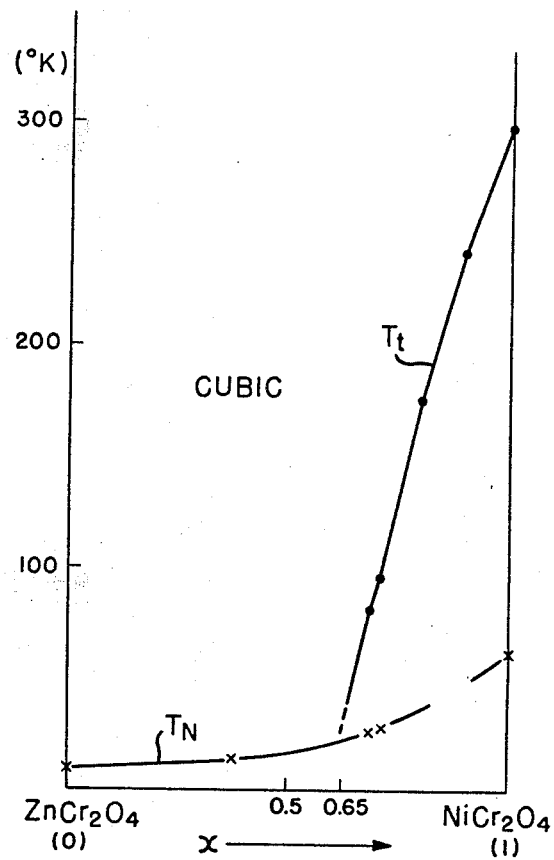
FIG. 2 is a phase diagram of the same system.

FIG. 2 is a phase diagram of a mixed crystal of $NiCr_2O_4$ and $ZnCr_2O_4$, wherein the abscissa indicates the proportion between $NiCr_2O_4$ and $ZnCr_2O_4$ and the ordinate is graduated in terms of absolute temperature °K. Curve $T_t$ is representative of the variation in the Jahn-Teller phase transition temperature of the mixed crystal of $Ni_xZn_{1-x}Cr_2O_4$ as value $x$ varies, while the curve $T_n$ represents the magnetic Curie point. The curve $T_t$ indicates that the phase transition temperature decreases as the amount of $ZnCr_2O_4$ in the mixed crystal increases up to 65%.

It is generally not easy to grow either single crystals of a spinel-type oxide exhibiting the Jahn-Teller effect or single crystals of a solid solution of such a spinel-type oxide and one or more of the oxides not exhibiting the Jahn-Teller effect. $CuFe_2O_4$, for example, is decomposed into $Cu_2O$, $Fe_2O_3$, $CuFeO_2$ and $Cu_{0.5}Fe_{2.5}O_4$ when heated to a temperature higher than about 900°C so that difficulties are experienced in growing it into a single crystal. With respect to $Mn_3O_4$, the $Mn^{3+}$ ions contributing to a cooperative Jahn-Teller effect becomes unstable at elevated temperatures so that the quality of the single crystal of $MN_3O_4$, if produced, will be unsatisfactory. Also, single crystals of $NiCr_2O_4$ or $FeCr_2O_4$ is not easily obtained by reason of their extremely high melting temperatures which exceed 2,000°C.

In accordance with the present invention, single crystals of a solid solution of $NiCr_2O_4$ and $ZnCr_2O_4$ are grown by use of a flux as described below.

Fine particles of $NiCr_2O_4$ and $ZnCr_2O_4$ are dissolved in $Bi_2O_3$ as a flux with a ratio by volume of 1 to 6. The mixture is heated in a platinum crucible at 1,300°C for 24 hours. The fused mixture is thereafter slowly cooled to about 1,000°C at a rate of 0.8°C per hour and thereafter the furnace is cooled to room temperature.

The particles of NiCr$_2$O$_4$ and ZnCr$_2$O$_4$ are completely dissolved in the flux of Bi$_2$O$_3$ when heated to 1,300°C and a single crystal of the solid solution of (NiZn)$_t$C-r$_2$O$_4$ precipitates at the bottom of the crucible as the result of the above-described cooling. The single crystal entrapped in the flux of Bi$_2$O$_3$ is then boiled in an aqueous solution of nitric acid of about 30% to 20% concentration for dissolving Bi$_2$O$_3$. The single crystal obtained in this manner is of a regular octahedron.

When a single crystal is grown by the use of a flux the resultant single crystal has usually minute cracks and involves a trace of the flux within the crystal in a stratiform configuration. The cracks are created also in the single crystal grown by the above described method at an early stage of the crystal growth. The cracks are, however, eliminated as the growth of the crystal proceeds and the single crystal finally obtained is completely free from the cracks.

Figure 3:
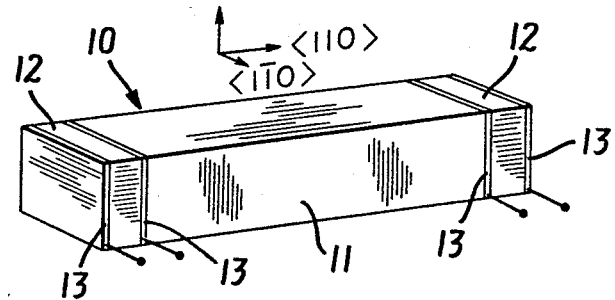
FIG. 3 is a perspective view of an ultrasonic delay device as a first embodiment of the invention.

The ultrasonic delay material according to the invention can be used for the production of devices or elements for providing time delays by converting electrical signals to ultrasonic signals and passing the latter signals therethrough. The elements may include those which are to be used in the fields of, for example, instrumentation, radar, television and underwater communication. As will be understood from the description hereinafter, the construction of the delay elements needs no fundamental modifications when the material of the invention is used in place of conventional materials such as, e.g., quartz. FIG. 3 shows a ultrasonic delay element generally indicated by reference numeral 10 as an embodiment of the invention. The element is essentially consists of a body 11 to serve as a ultrasonic wave path and a pair of conventional shear transducers 12. The body 11 is cut out from a single crystal of a Ni$_x$-Zn$_{1-x}$Cr$_2$O$_4$ solid solution (where $x$ is between 1 and 0.65) prepared by the above described method. The body 11 is of a quadrangular prism shape having a length of 7 mm in the direction of $>1\ 1\ 0>$ and a cross sectional area of $2 \times 2$ mm. The shear transducers 12 are of AC-cut quartz crystals for 10 MHz range, provided with usual electrodes 13 sputtered on the end surfaces thereof. The transducers 12 are bonded to the mirror finished end surfaces of the body 11 in the usual manner so that the direction of the polarization of the quartz crystal may coincide with the $<1\ 1\ 0>$ direction of the delay material crystal 11. It will be understood that any other piezo transducer for converting an electrical signal to a shear ultrasonic wave, e.g., of LiNbO$_3$, may be used in place of the quartz transducer 12.

Figure 4:
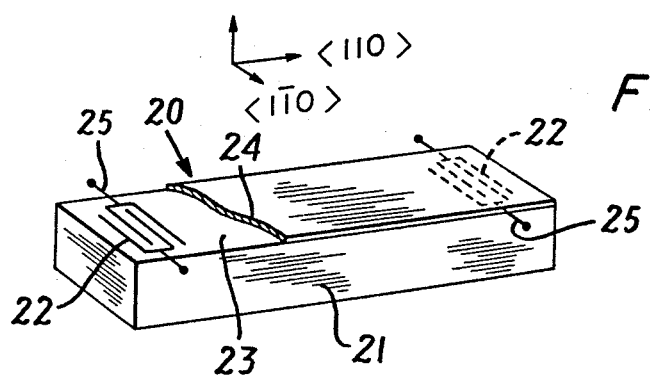
FIG. 4 is a perspecitve view of a slightly modified device as a second embodiment.

FIG. 4 shows another type of ultrasonic delay element 20 through which a surface wave is transmitted, while a bulk wave passes through the element 10 of FIG. 3. A body 21 of this element 20 is cut out from the afore-mentioned single crystal so that the longer side to the direction in which a shear wave is to be propagated may coincide with the $<1\ 1\ 0>$ direction of the crystal 21. A pair of conventional interdigital transducers 22 are formed on a surface 23 parallel to the $<1\ 1\ 0>$ and $<1\ \bar{1}\ 0>$ directions of the crystal 21 by the usual vapor deposition of a metal. The surface 23 is thereafter coated with a film 24 of ZnO or ZnS by the sputtering method, only exposing electrodes 25 of the transducers 22.

The function of the element 10 or 20 is identical with a conventional delay element of the similar construction but using a conventional delay material, except that the element 10 or 20 according to the invention can be extremely small-sized to provide the same magnitude of time delay.

It will be apparent that the ultrasonc delay elements according to the invention may be of various constructions other than the examples in FIGS. 3 and 4.

It is to be noted that the above described spinel-type oxide exhibiting a cooperative Jahn-Teller effect can be used also for accurate measurement of temperature in various fields, because the sound velocity therethrough is accurately dependent on the ambient temperature and because the effective temperature range thereof can be varied over a wide range by the variation of the composition of the oxide solid solution.

What is claimed is:

1. A process for producing a time delay in ultrasonic wave signals comprising the step of propagating an ultrasonic wave signal through a single crystal of a spinel-type oxide material exhibiting a cooperative Jahn-Teller effect, said oxide being maintained in a temperature-controlled environment at temperatures near and above the Jahn-Teller phase transition temperature thereof.

2. A process according to claim 1, wherein said spinel-type oxide is NiCr$_2$O$_4$.

3. A process according to claim 1, wherein said spinel-type oxide is a solid solution of NiCr$_1$O$_4$ and ZnCr$_2$O$_4$ represented for the formula $$Ni_xZn_{1-x}Cr_2O_4$$

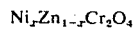

where $x$ is at least 0.65.

4. A process according to claim 3, further comprising the step of predetermining the value of $x$ to control the Jahn-Teller phase transition temperature of said solid solution.

5. A process according to claim 1, wherein said ultrasonic wave signal is produced by conversion from an electrical signal and is reconverted into said electrical signal after passing through said single crystal.

6. A device for producing a time delay in electrical signals convertible to ultrasonic wave signals comprising a single crystal of a spinel-type oxide material which exhibits a cooperative Jahn-Teller effect, said single crystal being shaped to provide a predetermined length of path for allowing a ultrasonic wave to propagate therethrough, and a pair of electrical-to-ultrasonic and ultrasonic-to-electrical signal transducers each attached to the ends of said path.

7. A device according to claim 6, wherein said spinel-type oxide is NiCr$_2$O$_4$.

8. A device according to claim 6, wherein said spinel-type oxide is a solid solution represented by the formula $$Ni_xZn_{1-x}Cr_2O_4$$

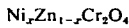

where $x$ is at least 0.65.

9. A device according to claim 6, wherein said single crystal is generally rectangular-prism-shaped, the longitudinal axis thereof being in the $<1\ 1\ 0>$ direction of said single crystal, and each of said transducers comprising a quartz crystal and being attached to each end surface perpendicular to said longitudinal axis of said single crystal.

10. A device according to claim 6, wherein said single crystal is generally rectangular-prism-shaped, the longitudinal axis thereof being in the $<1\ 1\ 0>$ direction of said single crystal, and each of said transducers being an interdigital transducer deposited on a side surface of said single crystal, said side surface and said transducers being coated with a film of a zinc compound selected from the group consisting of ZnO and ZnS.

* * * * *